US007329904B2

(12) United States Patent
Nawashiro et al.

(10) Patent No.: US 7,329,904 B2
(45) Date of Patent: Feb. 12, 2008

(54) LED LAMP DEVICE

(75) Inventors: Mitsuhiro Nawashiro, Aichi (JP); Satoshi Inagaki, Aichi (JP)

(73) Assignee: Toyoda Gosei Co., Ltd., Nishikasugai-Gun, Aichi (JP)

( * ) Notice: Subject to any disclaimer, the term of this patent is extended or adjusted under 35 U.S.C. 154(b) by 164 days.

(21) Appl. No.: 11/044,621

(22) Filed: Jan. 28, 2005

(65) Prior Publication Data

US 2005/0179064 A1 Aug. 18, 2005

(30) Foreign Application Priority Data

| | | |
|---|---|---|
| Jan. 30, 2004 | (JP) | P2004-024766 |
| Jan. 30, 2004 | (JP) | P2004-024774 |
| Sep. 24, 2004 | (JP) | P2004-277033 |

(51) Int. Cl.
*H01L 31/0232* (2006.01)

(52) U.S. Cl. .......................... 257/98; 257/99; 257/100; 257/E33.056; 257/E33.058; 257/E33.067; 313/512

(58) Field of Classification Search .................. 257/98
See application file for complete search history.

(56) References Cited

U.S. PATENT DOCUMENTS 5,813,752 A * 9/1998 Singer et al. ............... 362/293
6,661,030 B2 * 12/2003 Komoto et al. ............... 257/98
6,809,471 B2 * 10/2004 Setlur et al. ................ 313/503
6,893,143 B2 * 5/2005 Opolka ....................... 362/241
2002/0145152 A1 * 10/2002 Shimomura .................. 257/98

FOREIGN PATENT DOCUMENTS

JP 3-77307 8/1991
JP 2003-95016 4/2003

* cited by examiner

*Primary Examiner*—Sue A. Purvis
*Assistant Examiner*—Eduardo A. Rodela
(74) *Attorney, Agent, or Firm*—McGinn IP Law Group, PLLC

(57) ABSTRACT

An LED lamp device includes a light emitting element that emits light in a blue-based or violet-based color, an LED having a fluorescent material that emits fluorescent light in a yellow to yellow-green-based color in response to light received from the light emitting element, a lens having a light incident surface to which light emitted from the LED comes in and a convex lens part that radiates incident light, and a light shielding member provided on the light radiation side of the LED, having an opening, and made of a non-transmitting material to light from the LED. The member externally radiates light from the LED radiated through the lens from the opening and cuts the peripheral part of the light from the LED. Therefore, illumination light with no color irregularity in yellow observed around the illumination region can be provided, and a lamp device suitable for illumination can be provided.

20 Claims, 9 Drawing Sheets

LED LAMP DEVICE

This application is based on Japanese Patent Application Nos. 2004-024766, 2004-024774 and 2004-277033, which are incorporated herein by reference.

BACKGROUND OF THE INVENTION

1. Field of the Invention

The present invention relates to a lamp device using an LED, and more specifically, to a spotlight illuminating device using a white LED provided inside a vehicle.

2. Description of the Related Art

There are various kinds of illumination in a vehicle such as wide range illumination by a room lamp and illumination for a step part from a light source provided at a door or the like. These kinds of illumination are mainly necessary for example for securing safety at the time of getting in and out of the vehicle, reading a map, and operating audio equipment. In recent years, LEDs have come to replace light bulbs and fluorescent lamps as light sources for these purposes (see for example JP-UM-A-03-77307 and JP2003-95016A).

In a related illuminating device using an LED for a light source, an LED that emits white light suited for the illumination purpose is used. There are different ways of obtaining white light using LEDs. In one way, light components from light emitting elements for three primary colors, red, blue, and green are mixed. In another way, blue light from a light emitting element for blue and yellow fluorescent light excited by the blue light are mixed. Alternatively, fluorescent light components in three primary colors, red, blue, and green excited by ultraviolet light emitting element are mixed.

Among these methods, the method of mixing luminescent color from a blue light emitting element and fluorescent luminescent color from a fluorescent material is extensively utilized for obtaining white light because the method requires only a single light source and a single fluorescent material.

When white light obtained by mixing the luminescent color from the blue light emitting element and the fluorescent luminescent color from the yellow fluorescent material is converged into a spot for illumination using a lens, there is difference in the light emitting wavelength between the blue-based light and the yellow to yellow-green-based light, and the irradiation range varies depending on refraction. Consequently, color irregularity such as yellow noticeable particularly around the periphery of the illumination light is caused, and homogeneous fine quality light as illumination light cannot be obtained. Meanwhile, in the LED structure using a blue light emitting element and a yellow fluorescent material, the ratio of light converted into yellow by the fluorescent material is different between immediately above the light emitting element and the periphery depending on the optical paths before radiation, and the color irregularity is observed in the illumination light, which is a disadvantage caused by the structure.

SUMMARY OF THE INVENTION

The present invention is in view of the above described disadvantage, and it is an object of the invention to provide an illuminating device that can provide substantially homogeneous illumination color less costly with less color irregularity.

An LED lamp device according to a first aspect of the invention includes an LED having a light emitting element that emits light in a blue-based or violet-based color and a fluorescent material that emits fluorescent light in a yellow to yellow-green-based color in response to light received from the light emitting element, a lens having a light incident surface to which light emitted from the LED comes in and a convex lens part that externally radiates incident light, and a light shielding member provided on at least the light radiation side of the LED, having an opening, and made of a non-transmitting material to light from the LED. The member externally radiates light from the LED radiated through the lens from the opening and cuts the peripheral part of the light from the LED.

In this way, the light shielding member can shield the yellow light observed at the periphery of illumination light, so that more homogeneous illumination light with less color irregularity can be obtained. Furthermore, the peripheral part of the illumination light is shielded, so that illumination light in the form of spotlight having its periphery clearly defined can be obtained. Therefore, since the use of the LED light source with small heat release can obtain substantially as same illumination light as related LED light source, illumination is allowed to continue longer and the range of uses for the device is increased.

An LED lamp device according to a second aspect of the invention includes an LED including a light emitting element that emits light in a blue-based color and a fluorescent material that emits fluorescent light in a yellow to yellow-green-based color in response to light received from the light emitting element, and a lens provided on the light radiation side of the LED and having an incident concave portion to which light emitted from the LED comes in and a central radiation surface in a convex lens shape that externally radiates the emitted light. At the periphery of the lens, there are a peripheral reflection surface that reflects horizontal incident light from the incident concave portion in the vertical direction and a peripheral radiation surface that radiates light reflected by the peripheral reflection surface to the outside of the lens. These surfaces are provided integrally with the lens.

In this way, yellowish white light radiated toward the periphery of the LED is reflected by the peripheral reflection surface provided at the lens to the center of the irradiation area made of bluish white light, so that the yellowish white light is mixed with the bluish white light and white illumination light results. Consequently, homogeneous white illumination light with no color irregularity can be obtained, and a light source unit preferable as an illumination light source is provided. Therefore, since the use of the LED light source with small heat release can obtain substantially as same illumination light as related LED light source, illumination is allowed to continue longer and the range of uses for the device is increased.

DETAILED DESCRIPTION OF THE PREFERRED EMBODIMENTS

Figure 1:
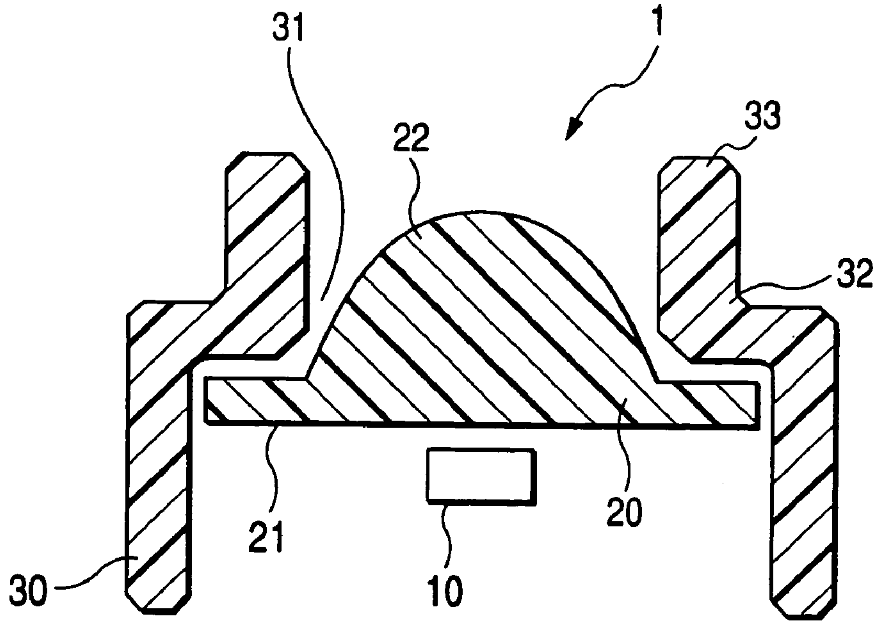
FIG. 1 is a side view of an LED lamp device 1 according to a first embodiment of the invention.

Now, the elements of the present invention will be described in detail.

According to the invention, an LED is used as a light source. A typical LED is for example a bullet type LED that has a lens for resin seal or an SMD type (surface mount type) LED in a packaged state. The SMD type LED provided with a lens can control the irradiation area in the range from diffuse light to spotlight.

As a white light emitting LED, a device that mixes light from a light emitting element and light from a fluorescent material excited by the light to produce white light is employed. As such a light emitting element, an LED using a blue-based light emitting element and a fluorescent material that emits yellow to yellow-green-based fluorescent light in response to the light from the light emitting element may be used. A violet-based light emitting element may also be used. In this case, in addition to the fluorescent material that emits yellow to yellow-green-based fluorescent light, a fluorescent material that emits blue-based fluorescent light in response to the light from the light emitting element is preferably used. The additional blue-based color component allows more preferably white light to be obtained.

The kind of fluorescent material is not particularly limited, and an organic or inorganic material may be used. The use of an organic fluorescent material allows clearer illumination light to be obtained. Meanwhile, the use of an inorganic fluorescent material allows more lusterless illumination light to be obtained.

According to the invention, a lens is provided on the light radiation side of the LED. The lens according to an embodiment of the invention has a light incident surface to which light emitted from the LED comes in and a convex lens part that externally radiates the incident light. In this way, light is converged as it passed through the convex lens part of the lens. This reduces the illumination range.

In a lens in another embodiment of the invention, the light incident surface to which light emitted from an LED comes in is formed into a concave spherical shape, while a convex lens part that externally emits the incident light is formed into a convex non-spherical shape. More specifically, this lens has a spherical lens part on the inner side (light incident side) and anon-spherical lens part on the outer side (light radiation side). In the lens, a light component with a short optical wavelength (light in blue or violet) emitted from the center of the LED is affected by the spherical lens when the light comes into the lens and is likely to be diffused to the outer side. In this way, the light component is directed more outwardly and therefore the light component and a light component with a long optical wavelength (light in yellow to yellow-green) are more mixed in the lens (between the inner spherical lens and the outer non-spherical lens). Meanwhile, the mixed light is eventually converged by the non-spherical lens on the outer side. At the time, the light is again mixed. In this way, light with very little color irregularity whose illumination range is reduced can be provided.

Herein, the "non-spherical surface" refers to for example an ellipsoid, a paraboloid, or an elliptic paraboloid.

Figure 5:
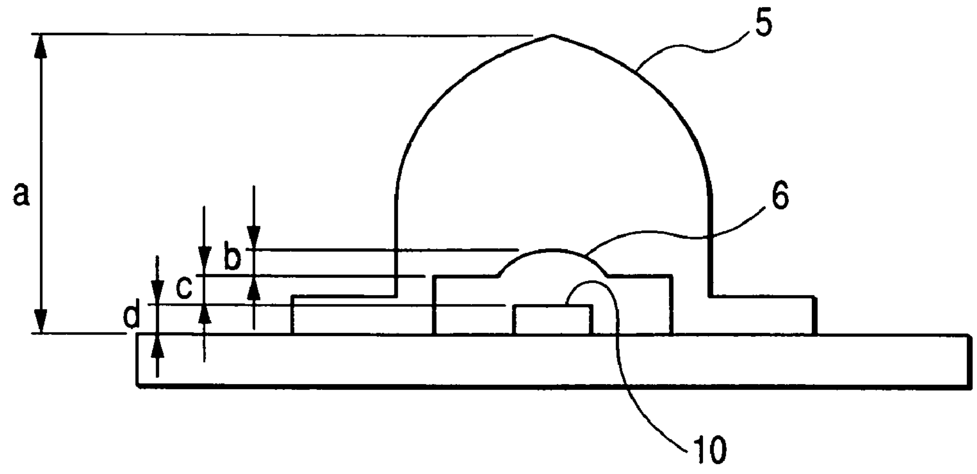
FIG. 5 is a view for use in illustration of the structure of a lens used according to the invention.

In this example, a lens is basically necessary for introducing sufficient light into a prescribed illumination area within a prescribed distance. In general, to narrow the illumination area, the curvature of the lens is reduced, while to widen the area, the curvature is increased. Meanwhile, spot-like light is necessary as a map lamp for example in a space inside an automobile. More specifically, a prescribed region should be illuminated with bright light, while the light should not reach the area surrounding the region. For example, in the structure shown in FIG. 5, when spot-like light is used to illuminate an area f that is about 600 mm apart from the LED lamp device and about as large as 400 mm, it is preferable that the outer non-spherical lens 5 is elliptical and has a curvature of R4.5±1, and the inner side spherical lens 6 has a curvature of R5±2. The distance a from the position of the LED 10 to the outer lens 5, the height b of the inner lens 6, the distance c from the LED 10 to the inner lens 6, and the height d of the lens 10 are related to the optical characteristics. In the conditions of the above described illumination area, a is in the range from 5 mm to 15 mm, preferably from 8 mm to 12 mm, more preferably about 10 mm. The height b is from 0.3 mm to 0.7 mm, preferably 0.4 mm to 0.6 mm, more preferably about 0.5 mm. Similarly, the distance c is from 0.6 mm to 1.0 mm, preferably 0.7 mm to 0.9 mm, more preferably about 0.8 mm. Similarly, d is from 1.5 mm to 2.3 mm, preferably 1.8 mm to 2.0 mm, more preferably about 1.9 mm. Note that the inner lens and the outer lens are different in that the former is spherical and the latter is non-spherical, but their curvatures are preferably substantially equal. The distance a is preferably about twice the curvature (when the curvatures of both lenses are the same).

According to one embodiment of the invention, there is a light shielding member having an opening at the light radiation side of an LED. The light shielding member cuts part of the light from the LED (light at the periphery). As a result, light defined by the shape of the opening of the light shielding member is externally emitted. The light shielding member is mainly used to control the state of illumination and/or to protect the LED against externally applied impact and to alleviate the LED's attachment with another member.

The light shielding member is made of a materiel that does not transmit light from the LED. For example, the material such as black, gray, and other dark color resin is used to mold the light shielding member.

According to another embodiment, a lens that controls light to be emitted to the light radiation side of the LED may be provided. The lens has an incident concave portion to introduce the emitted light from the LED to the surface opposing the LED, and a radiation surface that radiates light to the outside is provided at the surface positioned opposite to the surface on the light incident side. In the center of the radiation surface, a convex portion is provided so that the light can be converged and radiated. In the lens at the peripheral portion on the light incidence side, there is a peripheral reflection surface that reflects the incident light to the radiation surface.

First Embodiment

FIG. 1 shows an SMD type LED lamp device 1 according to a first embodiment of the invention. The LED lamp device 1 includes an LED 10, a lens 20 on the light radiation axis of the LED, and a housing 30 that packages the LED 10 and the lens 20. The lens 20 has an incident surface 21 to which light emitted from the LED 10 comes in, and a convex lens part 22 on the light radiation axis so that light entered into the lens 20 can be converged into spotlight. The convex lens part 22 desirably has a diameter that allows a sufficient quantity of the light emitted from the LED 10 to enter. The housing 30 has an opening 31 so that light emitted from the LED 10 and transmitted through the lens 20 can externally be radiated, and a light shielding member 32 cylindrically extending along the light radiation axis from the opening 31. The end 33 of the light shielding member 32 desirably protrudes in the direction of the light radiation axis of the LED beyond the convex lens part 22, so that the part of emitted light at the periphery is not externally radiated.

Figure 2:
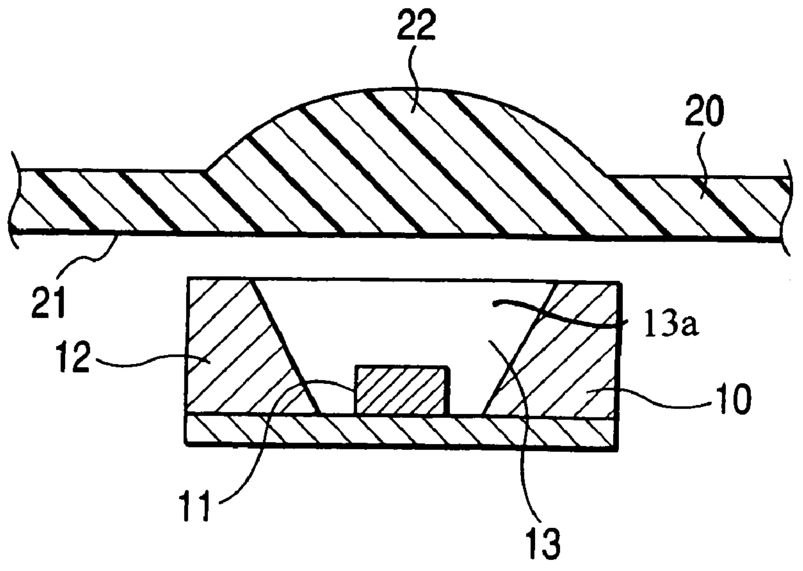
FIG. 2 is a side view of an SMD type LED and a lens.

FIG. 2 shows a part of the LED lamp device 1 that has the combination of the SMD type LED 10 and the lens 20. The LED lamp device 1 has the lens 20 provided to cover the light radiation side of the LED 10. The LED 10 stores a blue-based light emitting element 11 provided surrounded by a mortar-shaped reflector 12. In the space surrounded by the reflector 12 is filled with a light transmitting type, seal material 13 (such as epoxy resin) containing a yellow-green fluorescent material 13*a*. In the LED 10, a part of light emitted from the light emitting element 11 is used for exciting the fluorescent material, and the light (blue) from the light emitting element 11 is mixed with the fluorescent light (yellow-green) from the fluorescent material to obtain white light.

The lens 20 is made of acrylic resin. In the lens 20, the convex lens part 22 is provided in the position where light from the LED 10 is directed.

In the LED lamp device 1 as described above, light emitted from the LED 10 is radiated externally through the convex lens part 22. By the effect of the lens as the light passes through the convex lens part 22, the illumination light (externally radiated light) has its illumination range narrowed (becomes converged light).

Now, the state of illumination according to the invention will be described with reference to FIGS. 3 and 4. When the LED 10 is supplied with necessary electric power, blue-based light is emitted from the blue-based light emitting element 11 in the LED 10. Part of the blue-based light excites the fluorescent material as it passes through the seal material 13 in the LED 10 and yellow-green-based fluorescent light is generated. Consequently, white light produced as mixture of the blue-based light and yellow-green-based light is emitted from the LED 10. The optical path length of the white light from the LED 10 from the light emitting element 11 to the end of the seal material 13 through which the light is passed for external radiation differs between the area immediately above the light emitting element 11 and the periphery. Therefore, the ratio of light converted into the yellow-green-based color by the fluorescent material included in the seal material 13 is different between the area immediately above the light emitting element 11 and the periphery. More specifically, the light emitted immediately above the LED 10 is bluish white light at high color temperature because only a small quantity of light is converted into the yellow-green-based color. Meanwhile, the light emitted to the periphery of the LED 10 is yellowish white light at low color temperature because a large quantity of light is converted into the yellow-green.

A large part of the white light emitted from the LED 10 is introduced into the lens 20 through the opposing plane of incidence 21 at the backside of the lens 20. The light introduced through the plane of incidence 21 is converged by the function of the lens. In this way, the introduced light is efficiently guided into the convex lens part 22 in the upper part of the lens 20.

As described above, the light introduced into the lens 20 is externally radiated through the convex lens part 22 in the upper part. At the time, the directivity is increased by the function of the lens.

Figure 3:
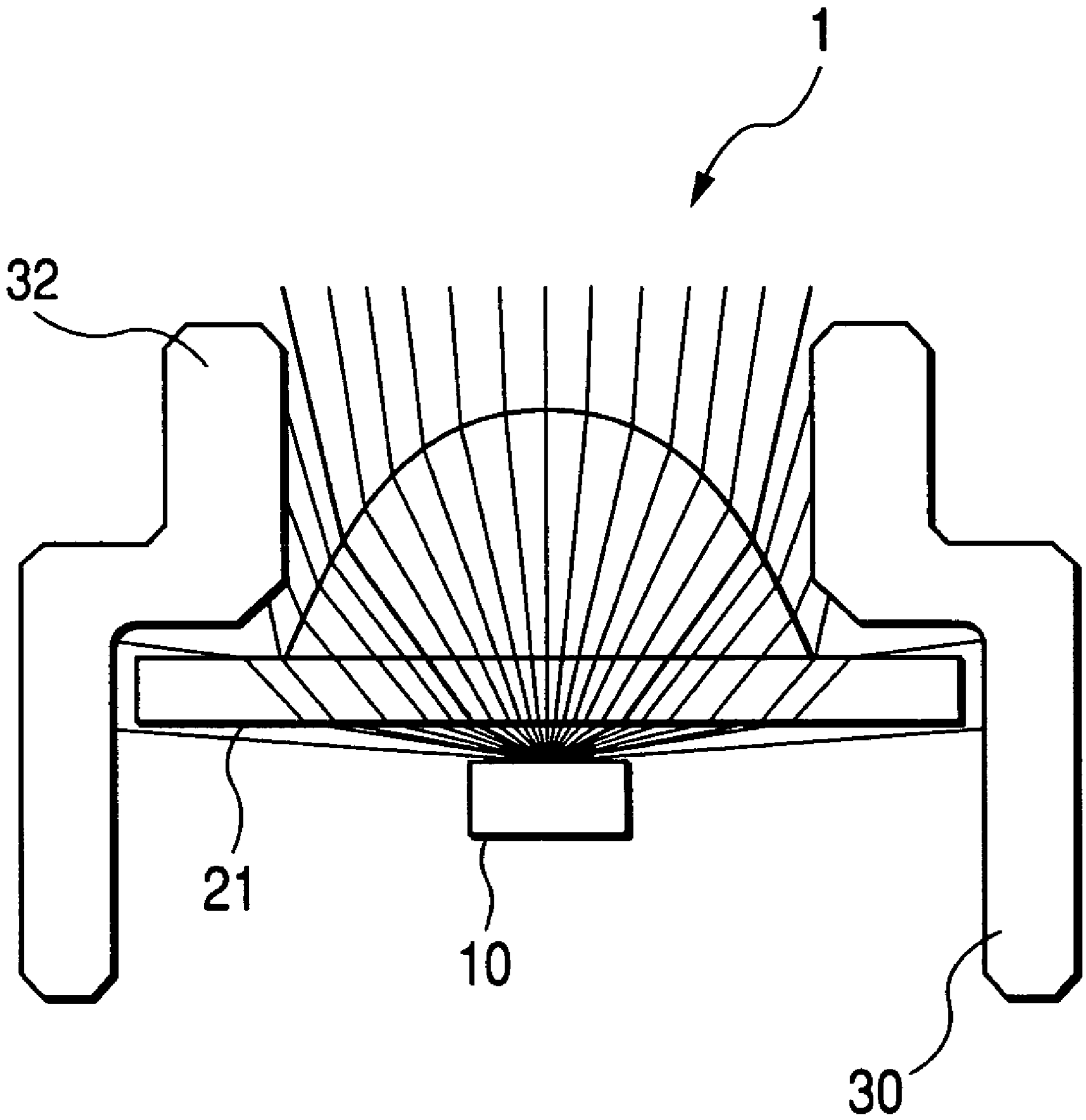
FIGS. 3 and 4 are views showing the state of illumination by the LED lamp device 1.
Figure 4:
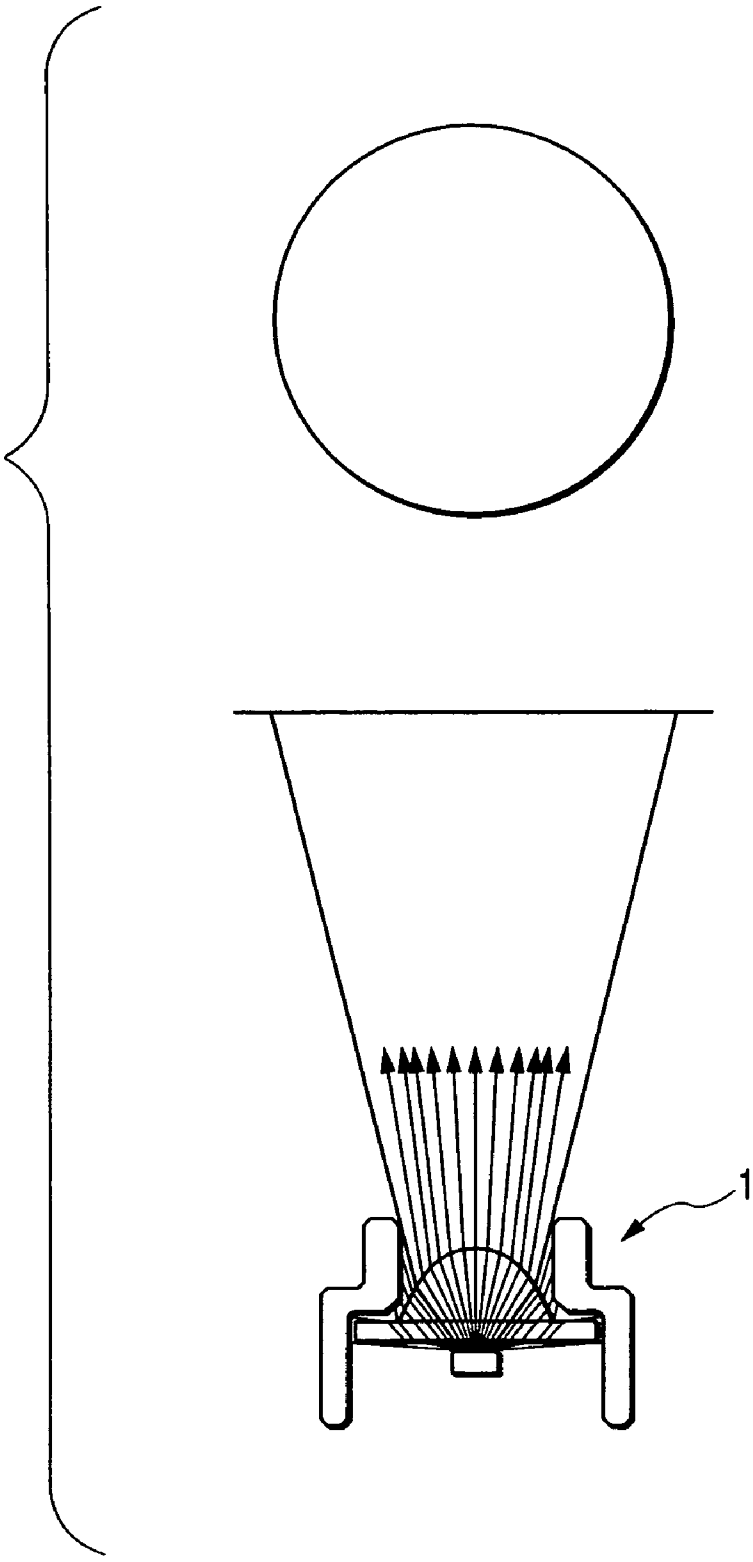

As shown in FIG. 3, in the light externally radiated from the lens 20, the light at the periphery is cut by the light shielding member 32 provided as an extension of the housing 30. In this way, yellow color irregularity observed at the periphery of the radiated light can be eliminated, and illumination light in homogeneous color can be obtained. As shown in FIG. 4, the boundary of the illumination range can clearly be defined.

In this way, with the LED lamp device 1 according to the embodiment, light externally radiated through the lens 20 concentrates in the central region, and light controlled within the illumination area is radiated. The peripheral part of the radiated light is cut, circular illumination light with no color irregularity results, and therefore a light source unit preferable as an illumination light source is provided.

Second Embodiment

Figure 6:
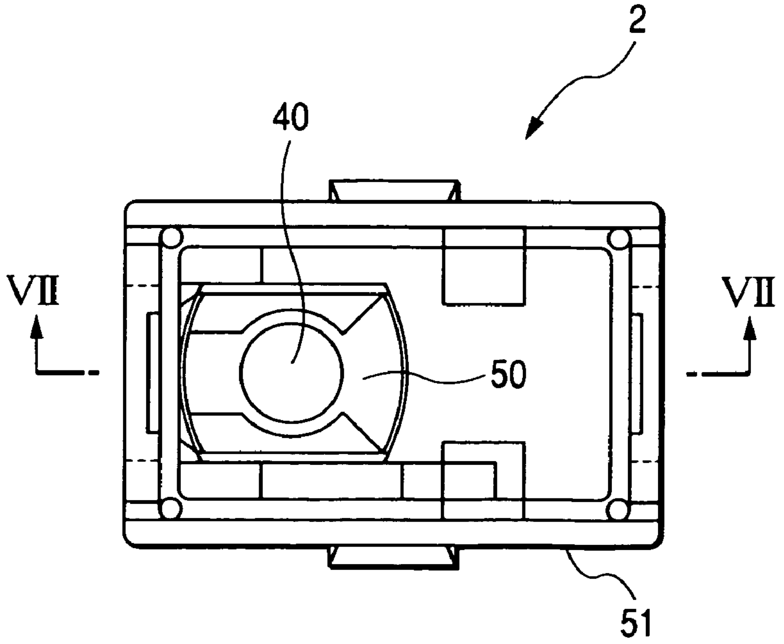
FIG. 6 is a plan view of an LED lamp device 2 according to a second embodiment of the invention.
Figure 7:
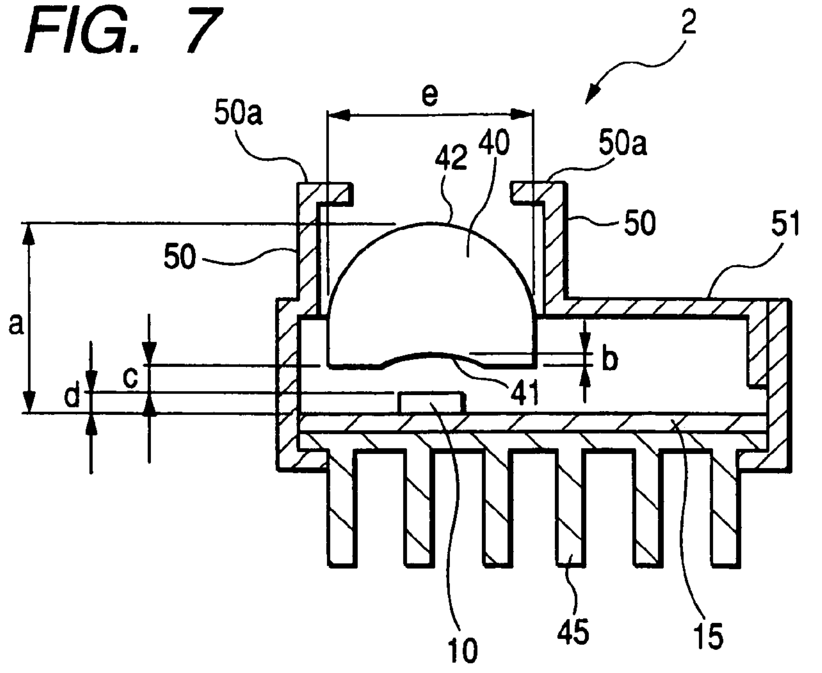
FIG. 7 is a sectional view of the LED lamp device 2 (taken along line VII-VII in FIG. 6)

A second embodiment of the invention is shown in FIGS. 6 and 7. FIG. 6 is a plan view of an LED lamp device 2. FIG. 7 is a sectional view taken along line VII-VII in FIG. 6. Note that in these figures, the same elements as those in the embodiment described above are denoted by the same reference characters and no further description will be provided about them.

As shown in FIG. 7, the LED lamp device 2 according to the embodiment includes a lens 40 having its inner side (to which light from the LED 10 comes in) and its outer side (from which light is radiated) formed to have prescribed curved surfaces. More specifically, the central region of the lens 40 on the inner side is a concave spherical surface (inner lens part 41) having a curvature of about R5.5. Similarly, the outer side of the lens 40 is a convex ellipsoid (outer lens part 42) having a curvature of about R4.5 except for its peripheral part. In the shown example, the size is as follows: a=about 10 mm, b=about 0.5 mm, c=about 0.8 mm, d=about 2.0 mm, and e=about 10 mm.

A heat sink 45 is provided under the mount substrate 15 of the LED 10. This provides a high heat dissipation effect.

A light shielding member 50 is provided to surround the lens 40. In the radiated light, the end 50*a* of the light shielding member 50 desirably protrudes in the direction of the radiation axis of the LED beyond the outer lens part 42.

In the LED lamp device 2, the above-described elements are packaged in a housing 51.

The LED lamp device 2 as described above illuminates as follows. Similarly to the LED lamp device 1 according to the first embodiment, when necessary electric power is supplied to the LED 10, white light is emitted from the LED 10 based on the mixture of blue-based light derived from the blue light emitting element 11 stored inside and yellow-green-based light generated as the fluorescent material is excited by the blue-based light. Note however that the white light has different color temperatures between the part emitted immediately above the LED (hereinafter also referred to as "immediately above component") and the part emitted toward the periphery of the LED (hereinafter also referred to as "peripheral component"). More specifically, the former is bluish white light at high color temperature, and the latter is yellowish white light at low color temperature. These kinds of light are taken into the lens 40 both through the inner lens part 41, but the immediately above component is likely to be scattered toward the periphery by the effect of the inner lens part 41 as it is taken into the lens. As a result, the immediately above component and the peripheral component are further mixed in the lens 40. The light taken into the lens 40 (the immediately above component and the peripheral component) proceeds as these components are mixed, and a large part of the light is eventually radiated to the outside through the outer lens part 42. At the time, the light is converged by the effect of the non-spherical lens. At the time, mixture of light takes place again. By the effect of the lens 40, the positive and efficient light mixture described above is carried out, and therefore in the eventually obtained light, the difference in the color temperature between the central region and the peripheral region is greatly reduced. More specifically, illumination light in which substantially no variation in the color temperature is observed on the whole (having extremely little color irregularity) results. Note that light radiated from the periphery of the lens 40 is cut by the light shielding member 50, so that illumination light in the form of spotlight having its periphery clearly defined can be obtained.

As in the foregoing, in the LED lamp device 2, spotlight with extremely little color irregularity and having the boundary of its illumination region clearly defined can be obtained. The spotlight is therefore preferably applied for example as a map lamp inside a vehicle.

Third Embodiment

Figure 8:
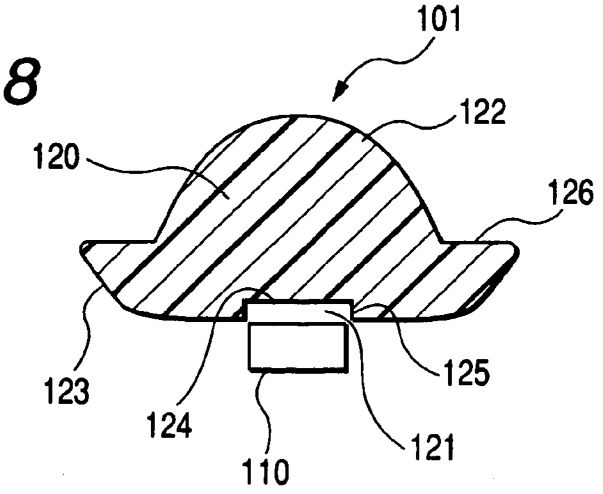
FIG. 8 is a side view of an LED lamp device 101 according to a third embodiment of the invention.

FIG. 8 shows an SMD type LED lamp device 101 according to a third embodiment of the invention. The LED lamp device 101 includes an LED 110 and a lens 120 on the light radiation axis of the LED. The lens 120 includes an incident concave portion 121 to which light emitted from the LED 110 comes in and a central radiation surface 122 having a convex lens shape on the light radiation axis so that light coming into the lens 120 is converged into spotlight. There is a reflecting surface 123 that reflects light coming in from the incident concave portion 121 at the side circumferential surface of the lens 120. The convex lens part 122 has a diameter large enough to capture and converge the radiated light coming in from the incident concave portion 121.

The lens 120 is made of light transmitting resin. The light transmitting resin may be for example acrylic resin or polycarbonate.

Figure 9:
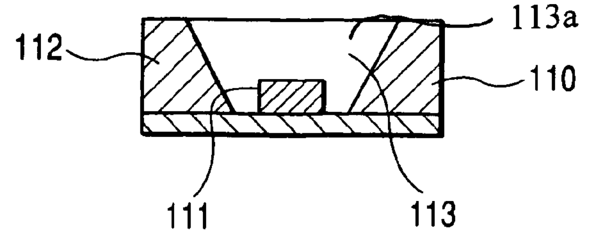
FIG. 9 is a side view of an SMD type LED.

FIG. 9 is a view of the SMD type LED 110. The LED 110 stores a blue-based light emitting element 111 surrounded by a mortar-shaped reflector 112. The space surrounded by the reflector 112 is filled with a light transmitting seal material 113 (such as epoxy resin) containing a yellow-green-based fluorescent material 113*a*. In the LED 110, part of the light from the light emitting element 111 is used for exciting the fluorescent material, and white light based on mixture of light (blue) from the light emitting element 111 and the fluorescent light (yellow-green) from the fluorescent material is obtained.

In the LED lamp device 1 as described above, light emitted from the LED 110 is externally radiated through the convex lens part 121. The illumination light (externally radiated light) has its illumination range narrowed (becomes converged light) by the effect of the lens applied upon the light as it passes through the convex lens part 121.

Figure 10:
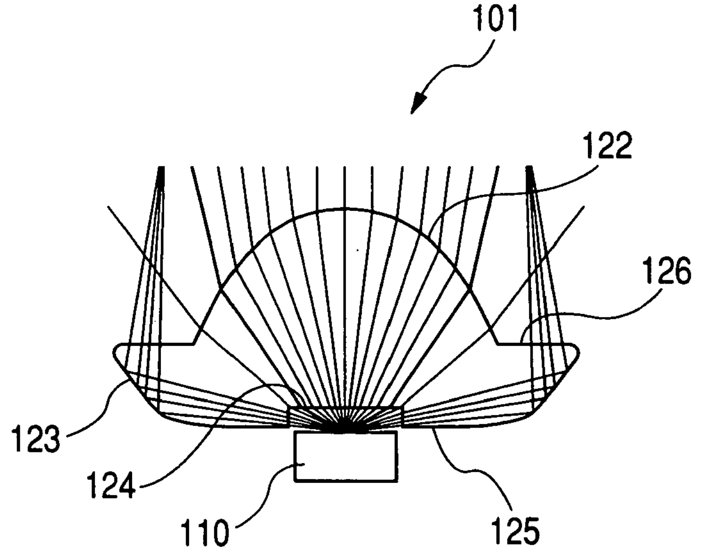
FIGS. 10 and 11 are views showing the state of illumination by the LED lamp device 101.

Now, the state of illumination according to the invention will be described with reference to FIGS. 10 and 11. When necessary electric power is supplied to the LED 110, blue-based light is emitted from the blue light emitting element 111 in the LED 110. Part of the blue light excites the fluorescent material as it passes through the seal material 113 in the LED 110 and yellow-based fluorescent light is generated as a result. Consequently, white light produced as mixture of the blue-based light and yellow-green-based light is emitted from the LED 110. The optical path length of the white light from the LED 110 from the light emitting element 111 to the end of the seal material 113 through which the light is passed for external radiation differs between the area immediately above the light emitting element 111 and the periphery. Therefore, the ratio of light converted into the yellow-based color by the fluorescent material included in the seal material 113 is different between the immediately above the light emitting element 111 and the periphery. More specifically, the light emitted toward immediately above the LED 110 is in bluish white light at high color temperature because a small quantity of light is converted into the yellow. Meanwhile, the light emitted toward the periphery of the LED 110 is yellowish white light at low color temperature because a large quantity of light is converted into the yellow.

Light emitted from the LED 110 comes into the upper plane of incidence 124 and the side plane of incidence 125 at the incident concave portion 121 of the lens 120. The incident light from the upper plane of incidence 124 is refracted at the upper plane of incidence 124, converged, then refracted at the central radiation surface 122 formed in the convex lens shape and converged for external radiation from the lens 120. Meanwhile, the incident light from the side plane of incidence 125 proceeds toward the peripheral reflection surface 123 as it is refracted by the side plane of incidence 125. The incident light is reflected by the peripheral reflection surface 123 in the direction of the radiation axis of the LED 110, and the reflected light is externally radiated from the lens 120 from the peripheral radiation surface 126 provided at the periphery of the central radiation surface 122. In this example, the peripheral reflection surface 123 is angled with respect to the incident light so that the reflected light becomes light converged toward the center of the illumination range not parallel to the radiation axis of the LED 110.

Figure 11:
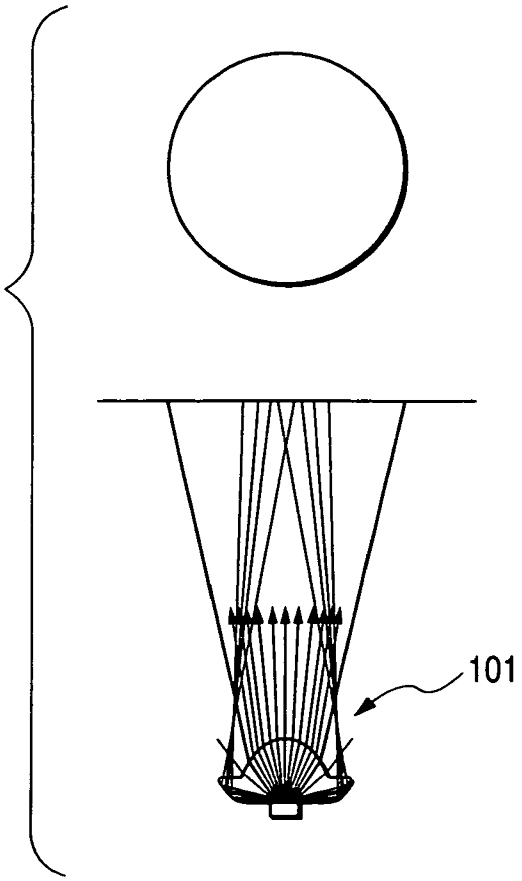

In this way, as shown in FIG. 11, light radiated from the central radiation surface 122 becomes spotlight focused having its irradiation area narrowed, so that the light radiated from the peripheral radiation surface 126 is condensed toward the center of the irradiation range.

In this way, in the LED lamp device 101, the light emitted from the LED 110 is concentrated in the central region and formed into condensed light through the central radiation surface 122 of the lens 120, so that light controlled within a desired illumination area is radiated. In the light emitted from the LED 110, yellowish white light radiated in the peripheral direction is reflected by the peripheral reflection surface 123 provided at the lens 120 toward the center of the irradiation area made of bluish white light, so that white light based on mixture of the yellowish white light and the bluish white light is radiated as white illumination light. Therefore, white illumination light free from color irregularity results, and a light source unit preferably used as an illumination light source can be obtained.

Fourth Embodiment

Figure 12:
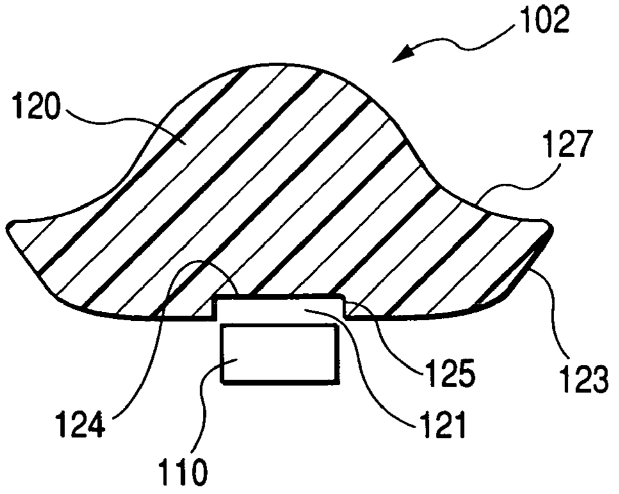
FIG. 12 is a side view of an LED lamp device 102 according to a fourth embodiment of the invention.
Figure 13:
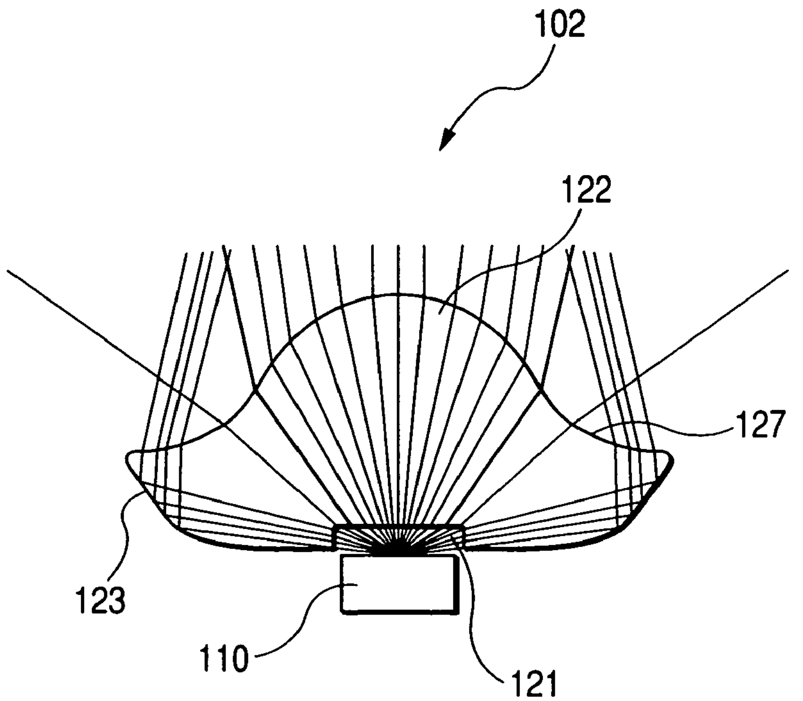
FIGS. 13 and 14 are views showing the state of illumination by the LED lamp device 102.
Figure 14:
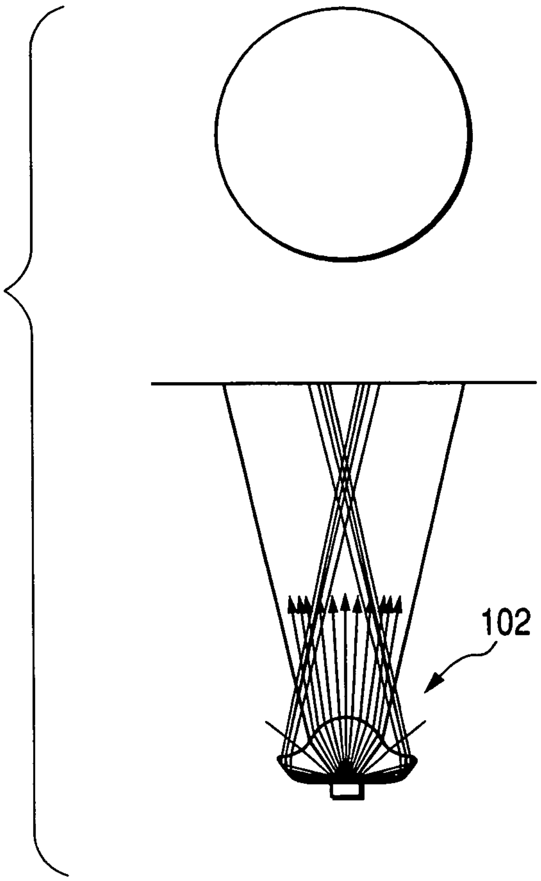

Now, an LED lamp device 102 according to a fourth embodiment of the invention will be described. FIG. 12 is a side view of the LED lamp device 102. FIGS. 13 and 14 show the state of illumination by the LED lamp device 102. In these figures, the same elements as those in the LED lamp device 101 described above are denoted by the same reference characters and no further description will be provided about them.

The LED lamp device 102 includes an LED 110 and a lens 120 on the light radiation axis of the LED. The lens 120 includes an incident concave portion 121 to which light emitted from the LED 110 comes in and a central radiation surface 122 in a convex lens shape provided on the light radiation axis so that incident light to the lens 120 can be condensed into spotlight. There are a reflection surface 123 that reflects incident light from the incident concave portion 121 on the side peripheral surface of the lens 120, and a peripheral radiation curved surface 127 that externally radiates the reflected light from the lens 120. The peripheral radiation curved surface 127 is made of a continues curved surface from the central radiation surface 122 as shown in FIG. 12. The central radiation surface 122 in a convex lens shape, while the peripheral radiation curved surface 127 is in a concave lens shape.

Now, the state of illumination according to the embodiment will be described with reference to FIGS. 13 and 14. When necessary electric power is supplied to the LED 110, white light is emitted from the LED 110. Note that the LED 110 emits light in the same manner as that according to the third embodiment, and therefore no further description will be provided about it. The light emitted from the LED 110 enters the lens 120 from the upper plane of incidence 124 and the side plane of incidence 125 of the incident concave portion 121 of the lens 120. The incident light from the upper plane of incidence 124 is refracted by the upper plane of incidence 124 to be converged, refracted by the central radiation surface 122 formed in a convex lens shape into converged light, and then externally radiated from the lens 120. Meanwhile, the incident light from the side plane of incidence 125 proceeds toward the peripheral reflection surface 123 as it is refracted by the side plane of incidence 125. The incident light is reflected by peripheral reflection surface 123 in the direction of the radiation axis of the LED 110, and the reflected light is externally radiated from the lens 120 from the peripheral radiation surface 127 provided as the continuos curved surface from the periphery of the central radiation surface 122. In this example, the peripheral radiation surface 127 has a mild concave surface so that the radiated light becomes light condensed toward the center of the radiation range of the LED 110.

In this way, as shown in FIG. 14, the light from the central radiation surface 122 is spotlight having its illumination area controlled, and the light from the peripheral radiation curved surface 127 is light condensed toward the center of the radiation range.

In the LED lamp device 102, the light emitted from the LED 110 is formed into focused light concentrated toward the central region through the central radiation surface 122 of the lens 120, and light controlled within a desired illumination area is radiated. In the light emitted from the LED 110, yellowish white light radiated to the periphery is radiated toward the center of the irradiation area made of the bluish white light by the peripheral reflection surface 123 and the peripheral radiation curved surface 127 provided at the lens 120, so that white light based on mixture of the yellowish white light and the bluish white light is radiated as white illumination light. Therefore, homogeneous white illumination light with no color irregularity results, and a light source unit preferably used as an illumination light source can be obtained.

Fifth Embodiment

Figure 15:
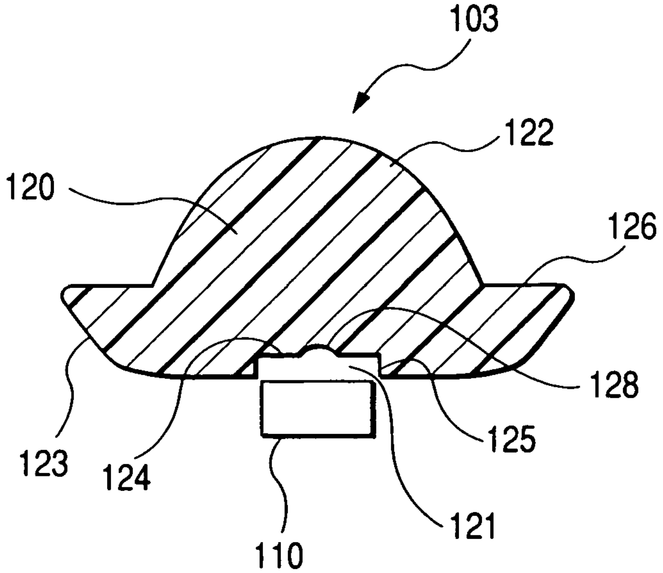
FIG. 15 is a side view of an LED lamp device 103 according to a fifth embodiment of the invention.
Figure 16:
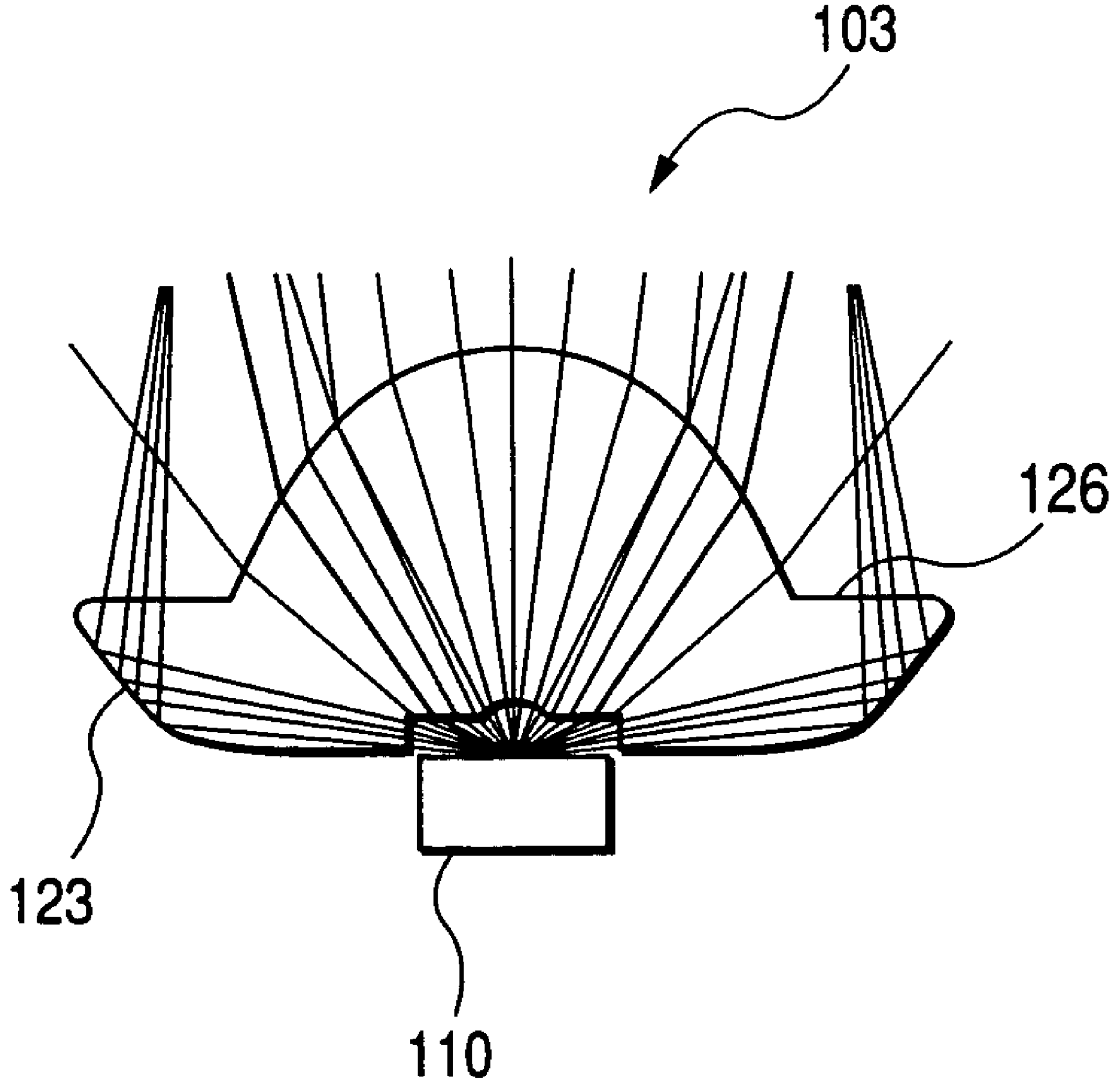
FIG. 16 is a view showing the state of illumination by the LED lamp device 103.

Now, an LED lamp device 103 according to a fifth embodiment of the invention will be described. FIG. 15 is a side view of the LED lamp device 103. FIG. 16 shows the state of illumination by the LED lamp device 103. Note that in these figures, the same elements as those in the above-described LED lamp device 101 are denoted by the same reference characters and no further description will be provided about them.

The LED lamp device 103 includes an LED 110 and a lens 120 on the light radiation axis of the LED. The lens 120 includes an incident concave portion 121 to which light emitted from the LED 110 comes in and a central radiation surface 122 in a convex lens shape provided on the light radiation axis so that incident light to the lens 120 can be condensed into spotlight. Note that there is an upper incident concave portion 128 to restrict the convergence of the incident light in the center of the upper incident surface 124 of the incident concave portion 121. There are a reflection surface 123 that reflects incident light from the incident concave portion 121 on the side peripheral surface of the lens 120, and a peripheral radiation surface 126 that externally radiates the reflected light from the lens 120.

Now, the state of illumination according to the embodiment will be described with reference to FIG. 16. When necessary electric power is supplied to the LED 110, white light is emitted from the LED 110. Note that the LED 110 emits light in the same manner as that according to the third embodiment, and therefore no further description will be provided about it. The light emitted from the LED 110 enters the lens 120 from the upper plane of incidence 124 and the side plane of incidence 125 of the incident concave portion 121 of the lens 120. The incident light from the upper plane of incidence 124 is refracted by the upper plane of incidence 124 to be converged, while the light entering from the upper incident concave portion 128 positioned in the center of the upper incident surface 124 enters with almost no refraction. The incident light from the upper plane of incidence 124 and the upper incident concave portion 128 is refracted by the central radiation surface 122 in a convex lens shape into condensed light, and then externally radiated from the lens 120. Meanwhile, the incident light from the side plane of incidence 125 proceeds toward the peripheral reflection surface 123 as it is refracted by the side plane of incidence 125. The incident light is reflected by the peripheral reflection surface 123 in the direction of the radiation axis of the LED 110, and the reflected light is externally radiated from the lens 120 at the peripheral radiation surface 126 provided at the periphery of the central radiation surface 122. In this example, the peripheral radiation surface 126 is formed so that the radiated light becomes light converged toward the center of the radiation range of the LED 110.

In the LED lamp device 103, the radiated light from the LED 110 is concentrated into condensed light toward the central region through the central radiation surface 122 of the lens 120, and light controlled within a desired illumination area is radiated. Note that in the bluish white light radiated immediately above the LED 110, light entering from the upper incident concave portion 128 is scattered in the illumination area with almost no refraction because of the shape of the upper incident concave portion 128 as the light comes in, and therefore the bluish white part in the center of the illumination area can be softened. The yellowish white light radiated toward the periphery in the light emitted from the LED 110 is radiated as it is scattered toward the center of the irradiation area made of the bluish white light by the peripheral reflection surface 123 and the peripheral radiation surface 120 provided at the lens 120, and therefore the yellowish white light is mixed with the bluish white light in the center of the illumination area and formed into white illumination light. Consequently, homogeneous white illumination light with no color irregularity can be provided, and a light source unit preferably used as an illumination light source can be obtained.

The LED lamp device according to the invention is preferably applied as illumination in a vehicle. Note however that the invention is not limited to this application and can extensively be applied for uses as spot type illumination.

The invention is not limited to the modes and embodiments described above. For example, the size or the number of LED can be changed. Various modifications in the range readily anticipated by a person skilled in the art without departing from the recitation of the appended claims are included in the scope of the invention.

What is claimed is:

1. An LED lamp device comprising:

an LED having a light emitting element and a fluorescent material that emits fluorescent light in response to light received from the light emitting element;

a lens having a light incident surface to which light emitted from the LED comes in and a convex lens part that externally radiates incident light; and a light shielding member having an opening, and comprising material non-reflective to light from the LED, the light shielding member externally radiating light from the LED radiated through the lens from the opening and removing a peripheral part of the light from the LED.

2. The LED lamp device according to claim 1, wherein the light shielding member is provided on at least the light radiation side of the LED.

3. The LED lamp device according to claim 1, wherein the light shielding member surrounds the LED and has a cylindrical shape that extends in the radiation axis of the LED.

4. The LED lamp device according to claim 3, wherein the cylindrical light shielding member has an end protruded in the direction of the radiation axis of the LED beyond the convex lens part of the lens.

5. The LED lamp device according to claim 1, wherein the LED emits white light having a large amount of blue component in the axial direction of the LED and white light having a large amount of yellow component in the direction perpendicular to the axial direction of the LED.

6. The LED lamp device according to claim 1, wherein the LED emits white light at high color temperature in the axial direction of the LED and white light at low color temperature in the direction perpendicular to the axial direction of the LED.

7. The LED lamp device according to claim 1, wherein the peripheral part of the light from the LED comprises a yellow to yellow-green color.

8. An LED lamp device comprising:

an LED having a light emitting element and a fluorescent material that emits fluorescent light in response to light received from the light emitting element;

a lens having a light incident surface to which light emitted from the LED comes in and a convex lens part that externally radiates incident light; and a light shielding member having an opening, and comprising material non-reflective to light from the LED, the light shielding member externally radiating light from the LED radiated through the lens from the opening and removing a peripheral part of the light from the LED, wherein the light emitting element emits light in a blue-based or violet-based color and the fluorescent material emits fluorescent light in a yellow to yellow-green-based color in response to light received from the light emitting element.

9. The LED lamp device according to claim 8, wherein a concave portion is formed on an underside of the lens.

10. An LED lamp device comprising:

an LED having a light emitting element and a fluorescent material that emits fluorescent light in response to light received from the light emitting element;

a lens having a light incident surface to which light emitted from the LED comes in and a convex lens part that externally radiates incident light; and a light shielding member having an opening, and comprising material non-reflective to light from the LED, the light shielding member externally radiating light from the LED radiated through the lens from the opening and removing a peripheral part of the light from the LED, wherein the light emitting element emits light in a violet-based color and the fluorescent material emits fluorescent light in a yellow to yellow-green-based color and a blue-based color in response to light received from the light emitting element.

11. An LED lamp device comprising:

an LED having a light emitting element and a fluorescent material that emits light in response to light received from the light emitting element;

a lens having a concave spherical lens part to which light emitted from the LED comes in and a convex non-spherical lens part that externally radiates incident light; and a light shielding member provided on the light radiation side of the LED, having an opening, and made of a material non-reflective to light from the LED, the light shielding member externally radiating light from the LED radiated through the lens from the opening and cutting the peripheral part of the light from the LED.

12. The LED lamp device according to claim 11, wherein the light emitting element emits light in a blue-based or violet-based color and the fluorescent material emits fluorescent light in a yellow to yellow-green-based color in response to light received from the light emitting element.

13. The LED lamp device according to claim 11, wherein the light emitting element emits light in a violet-based color and the fluorescent material emits fluorescent light in a yellow to yellow-green-based color and a blue-based color in response to light received from the light emitting element.

14. The LED lamp device according to claim 11, wherein the shape of the convex non-spherical lens part is one of an ellipsoid, a paraboloid, and an elliptic paraboloid.

15. The LED lamp device according to claim 11, wherein the LED emits white light having a large amount of blue component in the axial direction of the LED and white light having a large amount of yellow component in the direction perpendicular to the axial direction of the LED.

16. The LED lamp device according to claim 11, wherein the LED emits white light at high color temperature in the axial direction of the LED and white light at low color temperature in the direction perpendicular to the axial direction of the LED.

17. The LED lamp device according to claim 11, wherein the light shielding member is provided on at least the light radiation side of the LED.

18. The LED lamp device according to claim 11, wherein the light shielding member surrounds the LED and has a cylindrical shape that extends in the radiation axis of the LED.

19. The LED lamp device according to claim 11, wherein the cylindrical light shielding member has an end protruded in the direction of the radiation axis of the LED beyond the convex lens part of the lens.

20. The LED lamp device according to claim 11, wherein the concave spherical lens part comprises a parallel part to which light emitted from the LED comes in, the parallel part being parallel to a light emitting surface of the light emitting element.

* * * * *